United States Patent
Mortensen

(10) Patent No.: US 6,772,402 B2
(45) Date of Patent: Aug. 3, 2004

(54) FAILURE PATH GROUPING METHOD, APPARATUS, AND COMPUTER-READABLE MEDIUM

(75) Inventor: Michael Peter Mortensen, Fort Collins, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 122 days.

(21) Appl. No.: 10/136,338

(22) Filed: May 2, 2002

(65) Prior Publication Data

US 2003/0208727 A1 Nov. 6, 2003

(51) Int. Cl.$^7$ ................................................. G06F 9/45
(52) U.S. Cl. ........................................................ 716/6
(58) Field of Search ............................................ 716/6

(56) References Cited

U.S. PATENT DOCUMENTS 5,157,668 A  * 10/1992  Buenzli et al. ............... 714/26
5,896,301 A     4/1999  Barrientos
5,936,867 A     8/1999  Ashuri

FOREIGN PATENT DOCUMENTS

GB            2327127         1/1999

* cited by examiner

Primary Examiner—Stacy A. Whitmore

(57) ABSTRACT

A computer groups failing paths of a simulated, analyzed integrated circuit. The failing paths are listed and include series connected nodes having names. The node names are represented as node patterns and grouped into node pattern sets. The computer: (1) determines the node pattern in the node pattern set that is most likely to fail in response to a measure of probability of failure of a node pattern in a path on the failing path list, (2) creates a failing path set containing the paths most likely to fail based on the determination of (1), and (3) iterates until each path on the list is in a failing path set by using paths not placed in a failing path set and node patterns not determined to be most likely to fail.

28 Claims, 6 Drawing Sheets

US 6,772,402 B2

FAILURE PATH GROUPING METHOD, APPARATUS, AND COMPUTER-READABLE MEDIUM

FIELD OF THE INVENTION

The present invention relates to a method of and apparatus for grouping failure paths of integrated circuit designs, and to a computer-readable medium for enabling a computer to perform such grouping.

BACKGROUND ART

Very large scale integrated (VLSI) circuit design is a complex and time consuming engineering task. Functional blocks are groupings of integrated circuits to be fabricated, e.g., adders, shifters, and clock distribution mechanisms. Before an integrated circuit can be fabricated, the integrated circuit must pass many correctness, i.e., verification, checks if the circuit has many functional blocks. One such verification check is a static timing analysis. A static timing analysis traces all signal paths through a circuit and verifies that all signal paths meet or exceed the required timing constraints, i.e., the circuit is able to operate at or above a specified frequency. Passing paths are signal paths meeting or exceeding the timing constraints and failing paths are signal paths not meeting the timing constraints.

FIG. 1 is a portion of an exemplary circuit design, generally indicated by reference numeral 100. Circuit design portion 100 includes a set of functional blocks, i.e., FB1, FB2, FB1A, FB2A, and FB3–FB16 referenced by numerals 102–119 respectively, connected via signal paths. Functional blocks 104, 110, and 116 represent functional blocks receiving a signal from another portion (not shown) of the circuit design or from an input port of the circuit design. Functional blocks 104, 110, and 116 derive a signal using signal paths to connected functional blocks 102 and 105, 108 and 111, 114 and 117, respectively.

Functional blocks 102–119 represent processing circuits, i.e., a set of one or more transistors, for processing the input signal received from other functional blocks of the circuit design (not shown) or from an input port (not shown) of the circuit design. Functional blocks 102–119 may be any of a wide range of processing functionality, e.g., a single transistor, an inverter, an arithmetic logic unit (ALU), a floating point unit (FPU), or any other logic processing unit. Functional blocks 102–119 process the received input signal and transmit a signal to either (1) another of the functional blocks 105–116 or (2) an output port (not shown) of the circuit design.

Typically in a timing analysis resulting from a computer simulation of a proposed circuit design, transistors comprising the integrated circuit are grouped into functional blocks, and a graph of connected functional blocks, e.g., the graph of portion 100 of FIG. 1, is constructed. Each functional block may contain one or more transistors or functional blocks.

The timing analysis converts the functional block graph (FIG. 1) to a path and node graph (FIG. 2) by converting the signal path connecting functional blocks into nodes and converting the functional blocks into connections between nodes. In other words, the nodes are extracted from the functional block graph signal paths and logically connected by paths based on the functional blocks. Thus, the signal path connecting FB1 to FB2 is converted to a node generally indicated by a dashed line object 120 in FIG. 1. The signal path connecting FB3 to FB1 and FB1A is converted to a node generally indicated by a dashed line object 121. Functional block 102 connecting node 120 and 121, i.e., FB1, is converted to the path connecting the nodes 120, 121. Using the above-described procedure, FIG. 2 is a path and node graph 200 of converted functional block graph portion 100 of FIG. 1. The timing analysis lists each path in path and node graph 200 as a series of nodes and delay times, i.e., the time required for processing to complete during a particular path traversal.

As a result of the timing analysis, each path is categorized as passing or failing based on slack (i.e., required time for the path to perform an allocated operation less the actual performance time) or frequency (i.e., what is the maximum frequency that can be used before the path fails to perform the operation). A single functional block frequently contains many thousands of paths. Users use a static timing tool to request a report of the first N paths. Typically the timing analysis indicates some subset of the requested N paths are failing paths.

FIG. 2 is an exemplary set of nodes and paths of the portion 100 of the circuit design of FIG. 1. Nodes A, $B_1$, $B_2$, C, D, E, F, G, H, and I represent the input functional block(s) to a functional block of a circuit design. $B_1$ and $B_2$ are duplicate nodes and one node ($B_1$, or $B_2$, as appropriate) should be investigated if the designer determines the other is failing. For instance, the functional blocks FB1, FB1A of FIG. 1 forming the path providing input to nodes B1, B2 of FIG. 2 may be copies of an ALU design functional block.

For illustrative purposes, it is assumed that nodes B1, B2, and F are failing nodes (dashed circles), i.e., paths containing these nodes fail to meet or exceed the timing constraints. As a result, the timing analysis for the node and path graph portion 200 of FIG. 2 results in a passing path list of the path made up of connected nodes D, E, and F, i.e., nodes 124, 125, and 123 respectively. Because paths are reported from the timing analysis as a connected series of the node names of nodes making up the path separated by periods, the passing path is referred to as 'D.E.F'. Using this identification scheme, the failing path list includes the following paths: A.B1.C, A.B2.C, D.B2.C, G.E.F, G.H.F, and G.H.I.F, respectively indicated by reference numerals 202–207 (shown as shaded paths).

Circuit designers receive timing analysis results identifying the nodes and paths of a circuit design, a corresponding timing delay for each path, and lists of passing and failing paths based on timing constraints for the circuit design. Because of the large number of paths in circuit designs, there are frequently large numbers of failing paths requiring correction to meet or exceed the timing constraints. Correcting each failing path in turn and re-running the timing analysis requires a large amount of time. Fortunately in many circuits, a single node can cause numerous path failures and if the particular node can be identified, the large amount of time and effort required to identify and correct several related path failures can be minimized. To this end, circuit designers use numerous approaches, e.g., rules of thumb, designer intuition, circuit topology knowledge, and engineering judgment, to minimize the amount of time and effort required to identify defective nodes and ultimately circuit designs.

One method used by circuit designers to reduce the number of failing paths is grouping related failing paths into sets. These groupings, i.e., sets of failing paths, are sometimes referred to as 'buckets' by circuit designers and the process of grouping the failing paths is referred to as 'bucketizing'. Because a node can occur in many paths, a single bad node delay, resulting, e.g., from a driver too small for output loading thereof, might cause many paths to fail. Fortunately, in many cases, a single fix to a particular functional block corresponding to the bad node can simultaneously fix all the remaining failing paths which include the node.

Another method used by circuit designers to reduce the number of failing paths under consideration for correction is common grouping of nodes corresponding to common functional blocks. Most often, common grouping is related to bus lines on integrated circuit designs. If a single line of a bus has a problem, e.g., a particular functional block for driving a signal on a particular line, often every line of the bus has the same problem because the particular functional block is frequently duplicated for all lines of the bus. With reference to FIG. 2, common grouping might be employed by a designer to group paths containing B1 and B2, i.e., FB1 with FB1A and FB2 with FB2A referring to FIG. 1, because the functional blocks are duplicates. Thus, grouping failing paths 202 and 203, respectively A.B1.C and A.B2.C, because the paths differ only based on duplicate nodes B1 and B2, reduces by one half the number of paths identified for correction.

Grouping paths into failing path sets using any of the above-identified methods and information helps make debugging and fixing a functional block more manageable. Different designers create different failing path sets. To create a collection of failing path sets, the designer starts with the timing analysis node and path result. A failing path from the timing analysis is used to create a first failing path set in the failing path set collection. The designer selects failing paths typically based on designer instinct or 'gut feel' and circuit knowledge. The selected failing path is added to the first failing path set. Using the above described methods, additional failing paths are selected from the timing analysis and added to the first failing path set. During the process of matching failing paths to failing path sets, if a failing path does not match an existing failing path set, then the user creates a new failing path set in the failing path set collection and assigns the failing path to the failing path set. After many sets have been created, the designer will group (assigning failing paths to the sets created so far) to see which failing paths remain, and then create new sets for those remaining failing paths. In the ideal case, the process continues until the user has sorted all failing paths into failing path sets; however, because of the very large number of failing paths in the typical circuit design, designers stop grouping failing paths before all paths have been considered.

There may be several thousand failing paths, e.g., 5,000 out of 100,000 paths of an integrated circuit design. Creating failing path sets and repeatedly grouping failing paths until all failing paths are in a set are tedious processes frequently requiring at least a day of a designer's valuable time. While a designer is creating the sets, a team of engineers may be waiting for the results so they can start working on identifying and repairing the problems associated with the assigned sets.

Designers use their knowledge of the circuit design and rules of thumb to decide how to create a failing path set for a failing path. One rule of thumb is to identify a node with a very high routing delay. This approach works for some nodes in failing paths, but like any rule of thumb, there are counterexamples.

For example, because a global clock signal is distributed throughout the circuit, the corresponding timing path always has a high routing delay indicative of a failure path. However, the global clock signal appears in almost all passing paths as well, so the clock path is a poor choice to use for a failing path set.

Another problem encountered with previous approaches is a lack of sorting of failing paths, i.e., using previous approaches there is little or no failing path priority. Many of the failing path sets are created and filled using rules of thumb and the best guess of a designer. Additional information about the probability of failure of a given path is not taken into account to rank the failing paths. This information could be used to allocate limited design resources more efficiently.

As described above, there is a need in the art for an improved method of identifying failing path sets for failing path grouping.

DISCLOSURE/SUMMARY OF THE INVENTION

The above described objects are fulfilled by a method of grouping failing paths of an analyzed integrated circuit. Failing paths, including series connected nodes having names, are in a list. Node pattern sets are represented as grouped node names. The node pattern in the node pattern set that is most likely to fail is determined in response to a measure of probability of failure of a node pattern in a path on the list. Paths most likely to fail based on the determined most likely to fail node pattern are placed in a failing path set. The determining and placing steps are repeated until each path on the list is in a failing path set by using paths not placed in a failing path set and node patterns not determined to be most likely to fail.

In an apparatus aspect, a preferred embodiment of the present invention includes a computer-readable medium having at least one sequence of machine executable instructions for grouping failure paths of an analyzed integrated circuit design in machine form. The execution of the instructions by one or more processors causes the one or more processors to determine the node pattern in the node pattern set that is most likely to fail in response to a measure of probability of failure of a node pattern in a path on the list. Paths most likely to fail based on the determined most likely to fail node pattern are placed in a failing path set. Further execution of the instructions by a processor causes the one or more processors to executed the sequence of instructions until each path on the list is in a failing path set by using paths not placed in a failing path set and node patterns not determined to be most likely to fail.

In a system aspect, a preferred embodiment of the present invention includes grouping failing paths of an analyzed integrated circuit design. The system includes a processor and a memory coupled to the processor. The memory stores failing paths and sequences of instructions for execution by the processor. The failing paths include series connected nodes having names and the failing paths are included in a list. The node names in the failing paths are represented as node patterns and grouped into node pattern sets. The sequences of instructions, when executed by the processor, cause the processor to determine the node pattern in the node pattern set that is most likely to fail in response to a measure of probability of failure of a node pattern in a path on the list. The paths determined most likely to fail based on the determined most likely to fail node pattern are placed in a failing path set. The instruction sequence, when executed by the processor, further causes the processor to execute the sequence of instructions until each path on the list is in a failing path set by using paths not placed in a failing path set and node patterns not determined to be most likely to fail.

Still other objects and advantages of the present invention will become readily apparent to those skilled in the art from the following detailed description, wherein the preferred embodiments of the invention are shown and described, simply by way of illustration of the best mode contemplated of carrying out the invention. As will be realized, the invention is capable of other and different embodiments, and its several details are capable of modifications in various obvious respects, all without departing from the invention. Accordingly, the drawings and description thereof are to be regarded as illustrative in nature, and not as restrictive.

DETAILED DESCRIPTION

Figure 3:
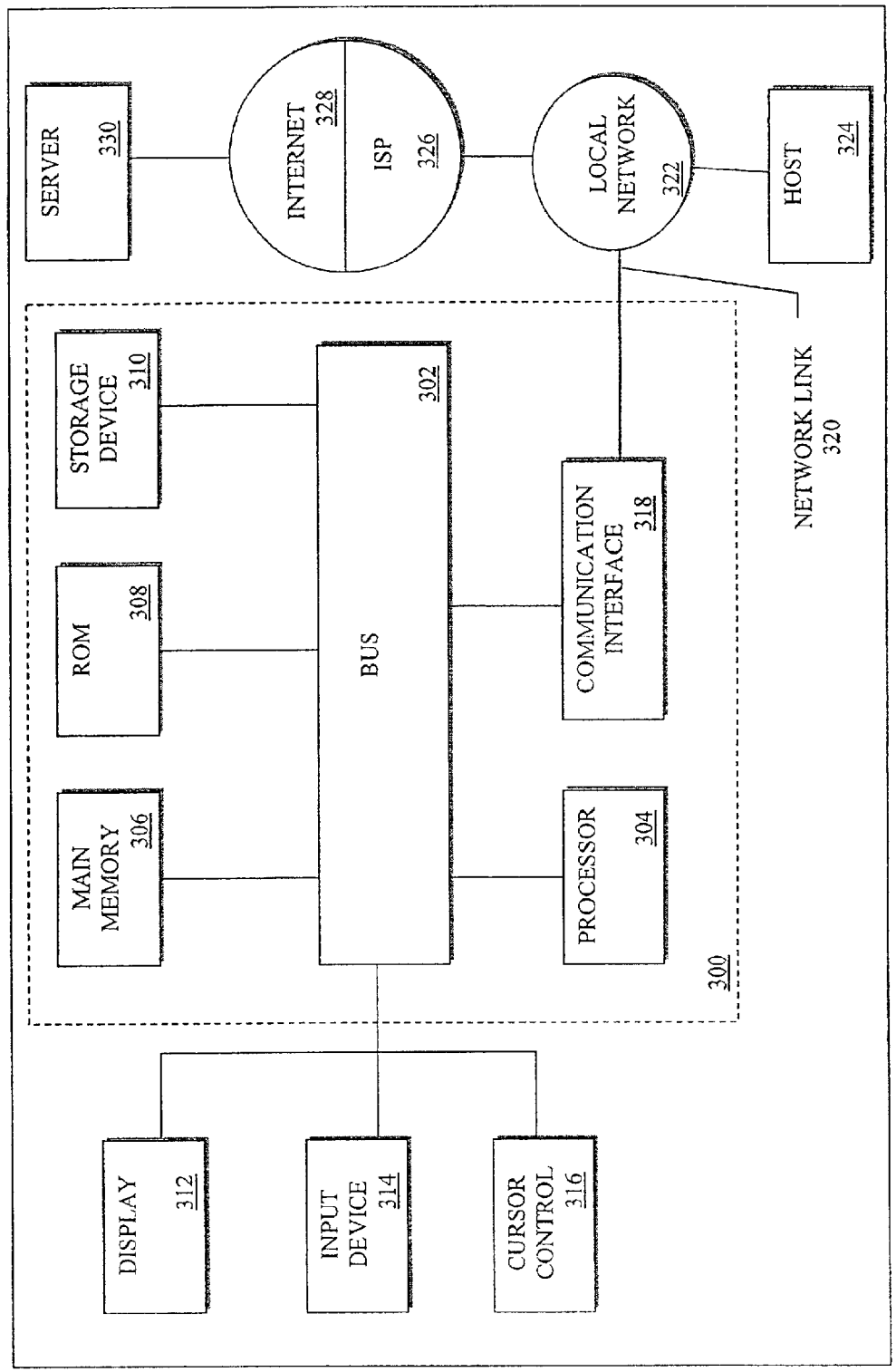
FIG. 3 is a high level block diagram of a computer system usable with a preferred embodiment of the present invention.

FIG. 3 is a block of an exemplary computer system 300 upon which an embodiment of the invention may be implemented. The present invention is usable with currently available personal computers, mini-mainframes and the like.

Computer system 300 includes a bus 302 or other communication mechanism for communicating information, and a processor 304 coupled with the bus 302 for processing information. Computer system 300 also includes a main memory 306, such as a random access memory (RAM) or other dynamic storage device, coupled to the bus 302 for storing path data, and instructions to be executed by processor 304. Main memory 306 also may be used for storing temporary variables or other intermediate information during execution of instructions to be executed by processor 304. Computer system 300 further includes a read only memory (ROM) 308 or other static storage device coupled to the bus 302 for storing static information and instructions for the processor 304. A storage device 310, such as a magnetic disk or optical disk, is provided and coupled to the bus 302 for storing path data and instructions.

Computer system 300 is coupled via the bus 302 to a display 312, such as a cathode ray tube (CRT) or a flat panel display, for displaying bucket generation information to a user. An input device 314, including alphanumeric and function keys, is coupled to the bus 302 for communicating information and command selections to the processor 304. Another type of user input device is cursor control 316, such as a mouse, a trackball, or cursor direction keys for communicating direction information and command selections to processor 304 and for controlling cursor movement on the display 312. This input device typically has two degrees of freedom in two axes, a first axis (e.g., x) and a second axis (e.g., y) allowing the device to specify positions in a plane.

Figure 1:
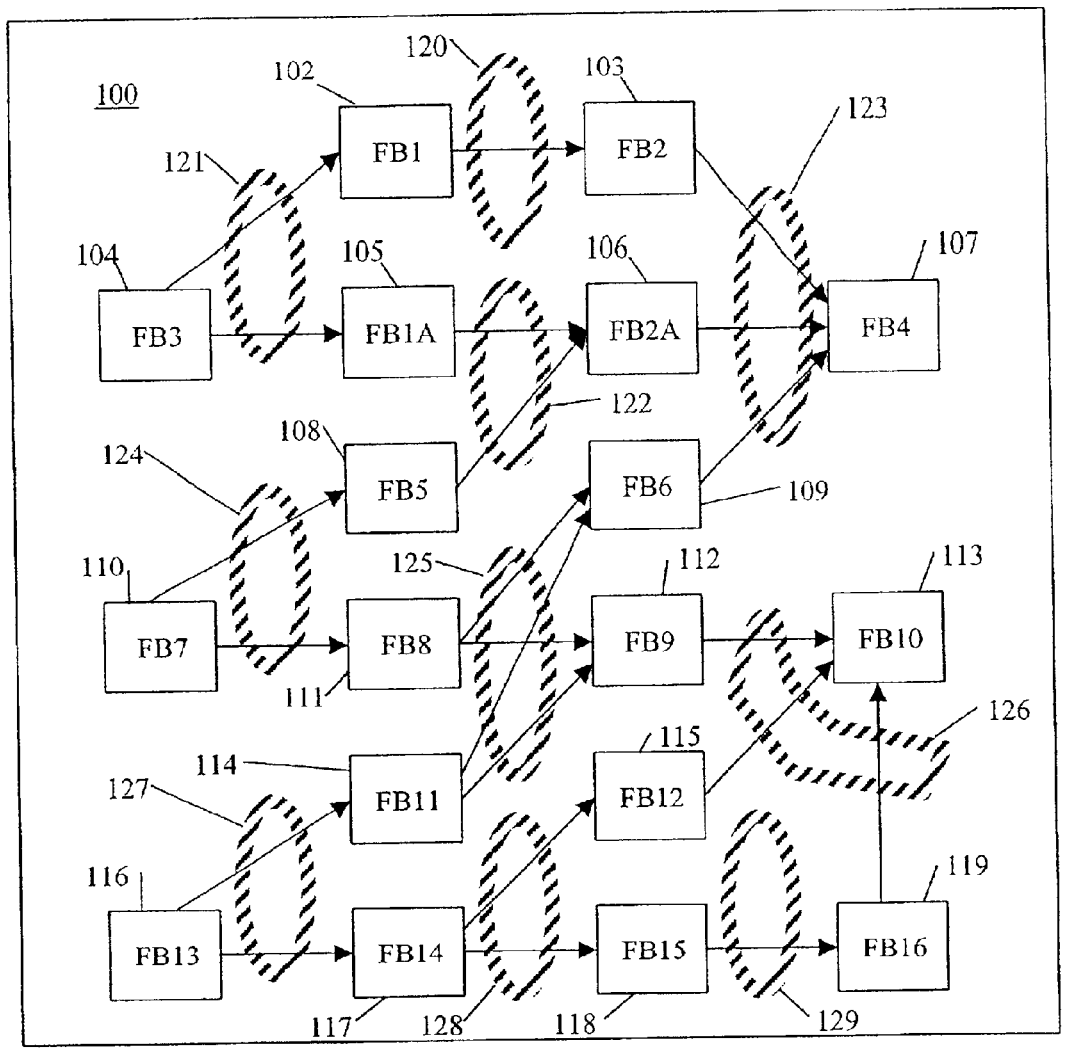
FIGS. 1 and 2, as previously described, are respectively examples of a prior art integrated circuit design and a node and path diagram for the circuit design.

Computer system 300, automatically generates buckets for failing paths of an integrated circuit design such as the design of FIG. 1. The invention, the failing path buckets are generated by computer system 300 in response to processor 304 executing sequences of instructions contained in main memory 306 in response to input received via input device 314, cursor control 316, or communication interface 318. Such instructions may be read into main memory 306 from another computer-readable medium, such as storage device 310.

However, the computer-readable medium is not limited to devices such as storage device 310. For example, the computer-readable medium can include a floppy disk, a flexible disk, hard disk, magnetic tape, or any other magnetic medium, a compact disc-ROM (CD-ROM), any other optical medium, punch cards, paper tape, any other physical medium with patterns of holes, a RAM, a programmable ROM (PROM), an erasable programmable ROM (EPROM), a flash-EPROM, any other memory chip or cartridge, a carrier wave embodied in an electrical, electromagnetic, infrared, or optical signal, or any other medium from which a computer can read. Execution of the sequences of instructions contained in the main memory 306 causes the processor 304 to perform the process steps described below. In alternative embodiments, hard-wired circuitry may be used in place of or in combination with computer software instructions to group the failing paths. Thus, grouping the failing paths is not limited to any specific combination of hardware circuitry and software.

Computer system 300 also includes a communication interface 318 coupled to the bus 302. Communication interface 308 provides two-way data communication as is known. For example, communication interface 318 can be an integrated services digital network (ISDN) card, a digital subscriber line (DSL) card, or a modem to provide a data communication connection to a corresponding type of telephone line. As another example, communication interface 318 can be a local area network (LAN) card to provide a data communication connection to a compatible LAN. Wireless links can also be implemented. In any such implementation, communication interface 318 sends and receives electrical, electromagnetic or optical signals which carry digital data streams representing various types of information. Of particular note, the communications through interface 318 can provide transmission or receipt of path failure information and generated bucket information. For example, two or more computer systems 300 can be networked together in a conventional manner with each using the communication interface 318.

Network link 320 typically provides data communication through one or more networks to other data devices. For example, network link 320 can provide a connection through local network 322 to a host computer 324 or to data equipment operated by an Internet Service Provider (ISP) 326. ISP 326 in turn provides data communication services through the world wide packet data communication network now commonly referred to as the "Internet" 328. Local network 322 and Internet 328 both use electrical, electromagnetic or optical signals which carry digital data streams. The signals through the various networks and the signals on network link 320 and through communication interface 318, which carry the digital data to and from computer system 300, are exemplary forms of carrier waves transporting the information.

Computer system 300 can send messages and receive data, including program code, through the network(s), network link 320 and communication interface 318. In the Internet example, a server 330 transmits a requested code for an application program through Internet 328, ISP 326, local network 322 and communication interface 318. In accordance with an embodiment of the invention, one such downloaded application groups failing paths of integrated circuits.

The received code is executed by processor 304 as it is received, and/or stored in storage device 310, or other non-volatile storage for later execution. In this manner, computer system 300 obtains application code in the form of a carrier wave.

The process flow 400 performed by computer system 300 to analyze a designed integrated circuit design e.g. the design of FIG. 1, is now described in detail with reference to FIG. 4. Initially computer system 300 performs step 402, wherein simulation results of the integrated circuit design are received by computer 300. The simulation results are the output of a static timing analysis performed using prior art software analysis tools, e.g., PathMill manufactured by Synopsys, Inc. After receipt of the simulation results, computer 300 proceeds to step 404 wherein failing path sets are generated, as described in detail below. Upon completion of failing path set generation step 404, computer 300 proceeds to step 406 and merges selected failing paths as described in detail below. Then computer 300 advances to step 408 wherein the result of the failing path merging steps 406 is supplied to display 312 for graphical display and/or stored in storage device 310 for later or additional use.

The operations computer 300 performs during failing path set generation step 404 are now described in detail with reference to FIG. 5. During step 502, computer 300 initializes a data structure, i.e., failing path list 602 (described with reference to FIG. 6) stored in memory 306 or storage device 310, for storing failing paths. Specifically, paths falling below a particular frequency, i.e., a passing frequency, are added to the failing path list 602. In an alternate embodiment, failing path list 602 is created in memory during initializing step 502.

Then, during step 504, computer 300 converts each node name in a particular path in failing path list 602 to a node pattern. During conversion step 504, computer 300 removes bus notation of the designed simulated integrated circuit so that all bus lines are treated as a single line e.g., address lines $a\_bus_1$ through $a\_bus_{16}$ of a 16 bit address line are treated as a single $a\_bus^*$ address line. Additionally, resistors and capacitors added to the logical circuit design to meet electrical design requirements are removed during conversion step 504.

Upon completion of conversion step 504, computer 300 proceeds to step 506 during which the computer determines whether each node pattern exists in a node pattern set. Initially, there are no node pattern sets and the result is negative. If the result of the step 506 determination is negative, computer 300 proceeds to step 508 wherein the computer adds the converted node pattern to the node pattern set. After step 508, computer 300 proceeds to step 410. If computer 300, during step 406, determines that the node pattern is in the node pattern set, computer 300 proceeds to step 510.

In step 510, computer 300 determines whether node paths in failing path list 602 remain to be converted and matched against the node pattern set. If the outcome is positive, computer 300 returns to step 504 to operate on node names in another failing path in failing path list 502. If the outcome is negative, computer 300 proceeds to step 512.

In step 512, computer 300 determines the most likely to fail (MLTF) node pattern of the node pattern set by comparing the probability that a path will fail if the path contains a given node pattern. Formally stated, the probability is written as:

$$p(x)=P(path\_is\_failing|path\_contains\_node\_pattern\_x) \quad \text{(Equation 1)}$$

The "|" in Equation 1 on the right hand side (RHS) denotes conditional probability. Thus, the RHS of Equation 1 is read as "the probability that a path is failing given that the path contains node pattern x."

In a preferred embodiment, computer 300 calculates the probability of Equation 1 for a particular node pattern by dividing the number of failing paths containing the node pattern by the total number of paths in the integrated circuit containing the node pattern. If two node patterns evaluate to an equal probability of failure, the node pattern occurring in the most failing paths is determined to be the MLTF node pattern.

Valuable information from passing paths is used in determining the MLTF pattern, yet only the failing paths are grouped. For cases where many patterns have the same probability, the number of failing nodes is used as the tie breaker. This has the effect of greedily taking nodes which fail all or most of the time and occur in the most paths first, thus shortening the depth of tree 600.

Computer 300 then proceeds to step 514 wherein the computer creates a failing path set 604 (depicted and described with reference to FIG. 6 below) for the MLTF node pattern identified by computer 300 in step 512. The failing path set 604 is another data structure added to a tree 600 data structure described below. Failing path set 604 is be similar to failing path list 602 data structure.

After creating the failing path set 604, the computer 300 proceeds to step 516 and removes paths matching or including the MLTF node pattern from failing path list 602.

Then, in step 518, computer 300 determines whether there are any paths remaining to be grouped. If there are paths remaining, computer 300 creates a new remaining failing path list 606 (depicted and described with reference to FIG. 6 below) and includes the failing paths from failing path list 602 not found in failing path set 604. Computer 300 returns to step 504 to perform another iteration of the process steps. Subsequent iterations of computer 300 executing the process steps result in additional failing path sets 608–612 and remaining failing path lists 606–610 being added to tree 600. If there are no paths remaining, the computer 300 proceeds to step 520 during which the computer supplies the grouped paths provided to failing path merging step 406.

In step 406, computer 300 merges the failing path sets from tree 600. For each failing path set, any numbers in the node pattern forming a basis for the particular set are replaced with a placeholder value, e.g., B1 and B2 are both converted to B*, and the node pattern of the failing path sets of tree 600 are compared to determine any matches. That is, the failing path set based on node pattern B1 will match with the failing path set based on node pattern B2. A result of failing path set merging is to group failing path sets based on hierarchical or multiple functional copies of functional blocks. For example, many microprocessors include multiple arithmetic logic units, commonly referred to as ALUs, which are exemplary functional blocks. In a circuit design, the multiple ALUs are individually numbered and referred to as ALU1, ALU2, and so on. Frequently, all the ALUs on a particular integrated circuit are the same, i.e. any design errors or failing paths discovered in a first ALU as applicable to all other copies of the first ALU. In this case, it is useful to reduce the number of failing path sets by considering the multiple ALUs as a single ALU.

Figure 6:
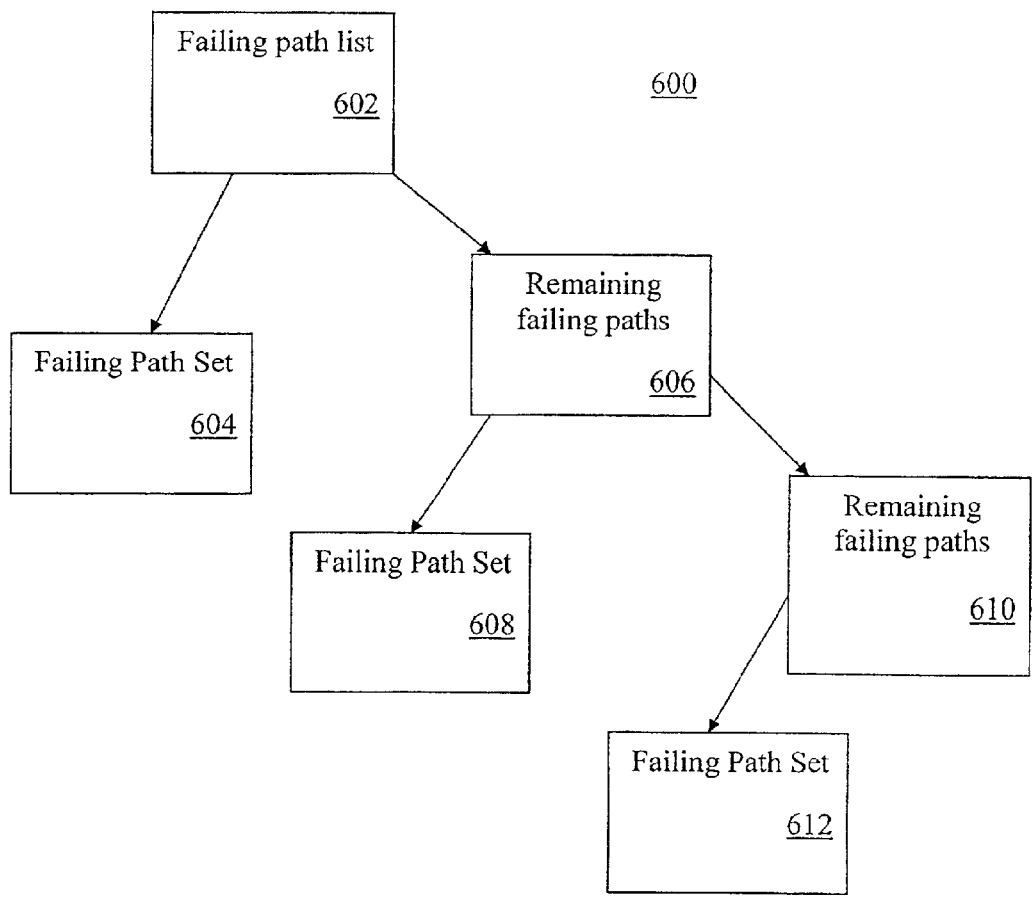
FIG. 6 is a high level data structure diagram of a data structure usable with an embodiment of the present invention.

The data structures of the failing path lists and the failing path sets are now described with reference to FIG. 6. The failing paths are stored as a degenerate tree, e.g., a linked list, data structure using only a single attribute at each level. FIG. 6 is a graphic depiction of an exemplary tree 600 stored in main memory 306. It is to be understood that different data structures are usable in carrying out the operation of the present invention and the data structures are merely exemplary in nature.

Failing path list 602, created as a result of the operations performed by computer 300 as described above with reference to FIGS. 4 and 5, is depicted at the upper left of the tree 600 in FIG. 6. From top to bottom and left to right, i.e., a left depth-first traversal, the tree 600 is now described. A subset of failing path set 602 matching a particular node pattern forms a first leaf, i.e., failing path set 604, on tree 600, i.e., paths containing the particular node pattern. The failing paths in failing path set 604 match the particular node pattern if the path includes the particular node pattern.

Computer 300, in creating the linked-list data structure comprising tree 600, links a first set of remaining failing paths 606 from the set of all failing paths 602. The first set of remaining failing paths 606 includes the subset of all failing paths not contained within failing path set 604. The subset of remaining failing paths 606 including a particular node pattern forms a second leaf, i.e., failing path set 608, on tree 600, so the second leaf of paths containing a pattern different from the first node pattern matched by the failing paths in failing path set 604.

Computer 300 links a second set of remaining failing paths 610 from the first set of remaining failing paths 606. The second set of remaining failing paths 610 includes the subset of remaining failing paths 606 not contained within failing path set 608. Computer 300 continues processing tree 600 in this fashion so that a subset of remaining failing paths 610 matching a final node pattern forms a third leaf, i.e., failing path set 612 on tree 600, so the third leaf includes remaining paths containing the final node pattern. Computer 300 stops processing tree 600 when there are no additional remaining failing paths to match a given pattern.

The number of failing path sets in tree 600 is limited to a maximum equal to the number of failing paths.

Figure 4:
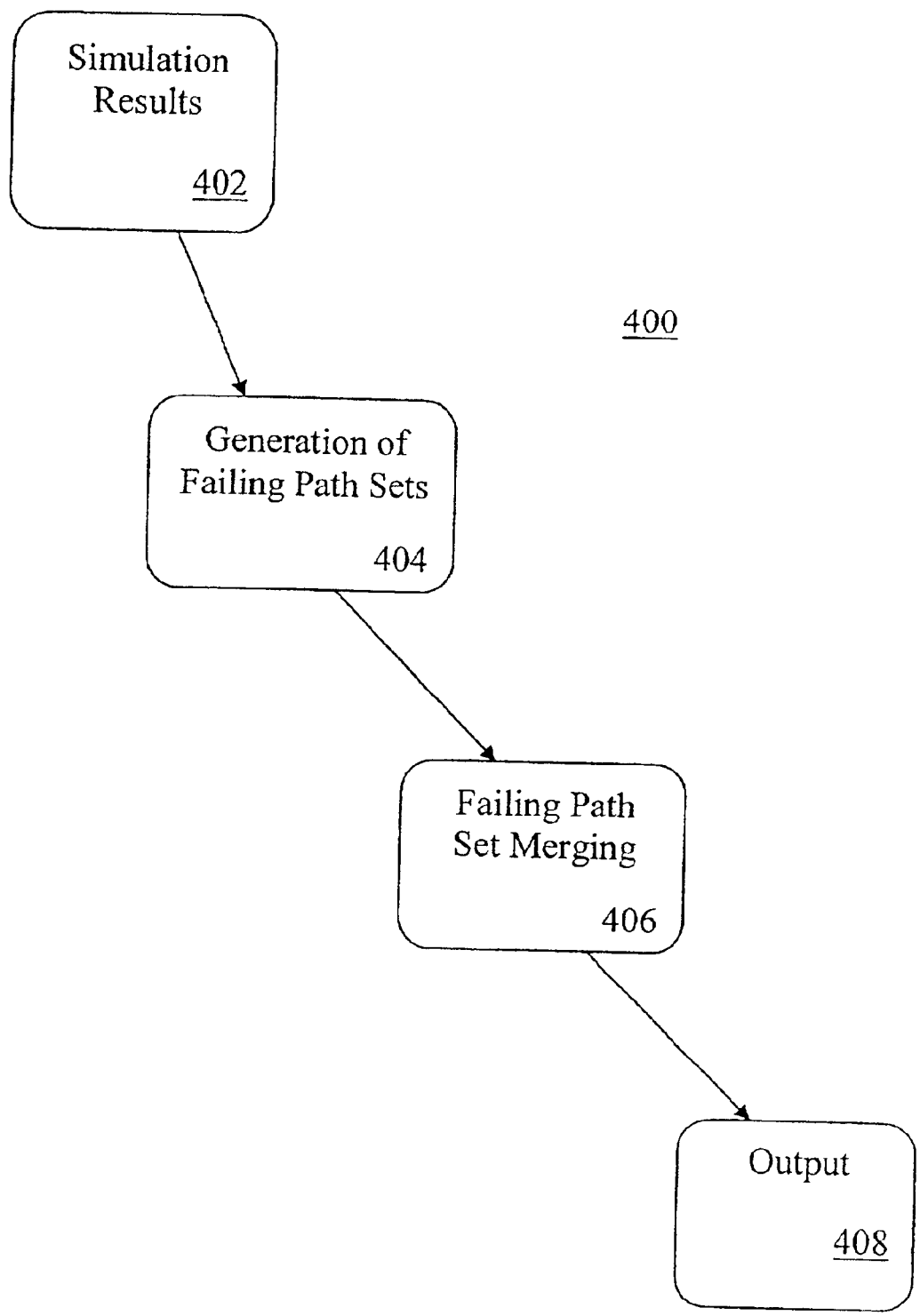
FIG. 4 is a high level flow diagram of operations the computer system of FIG. 3 performs to analyze a simulated integrated circuit in accordance with a preferred embodiment of the present invention.
Figure 5:
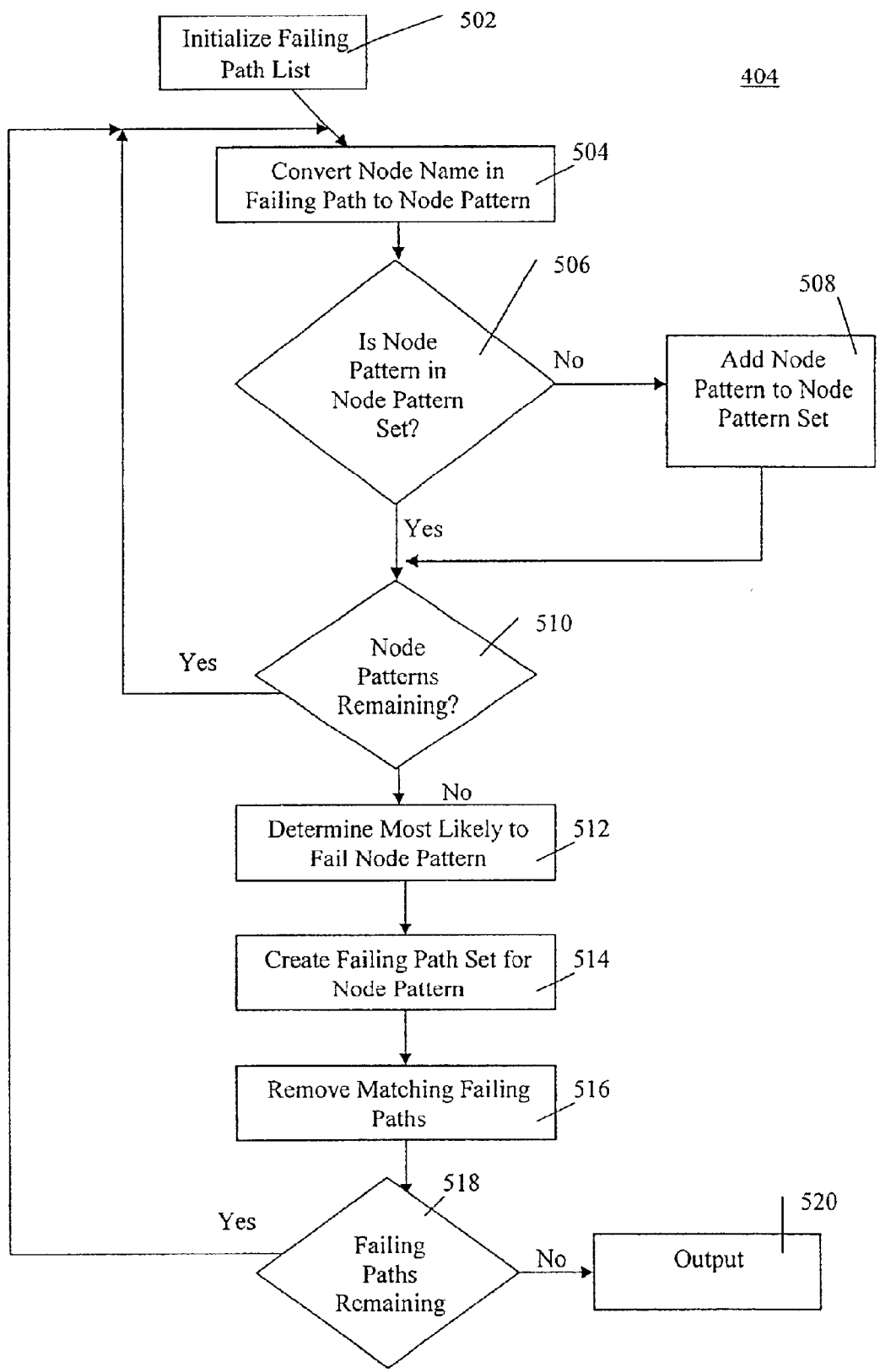
FIG. 5 is a flow diagram of a bucket generation portion of the flow diagram of FIG. 4.

The operations associated with the flowchart of FIGS. 4 and 5 were written in Perl5 and run on an HP-UX 10.20 operating system. Perl was chosen for its ease of use and ability to handle regular expressions, memory management, and hashes in a simple way. Using an input design of 100,000 total paths and 15,000 failing paths, the Perl implementation completed processing in approximately 15 minutes. A C++ implementation evaluating the same design, completed processing the failing path grouping process in approximately two minutes. A human evaluating the same design required two days to perform a similar failing path grouping. There is a considerable amount of time and cost savings by the present invention over a human-driven process.

Figure 2:
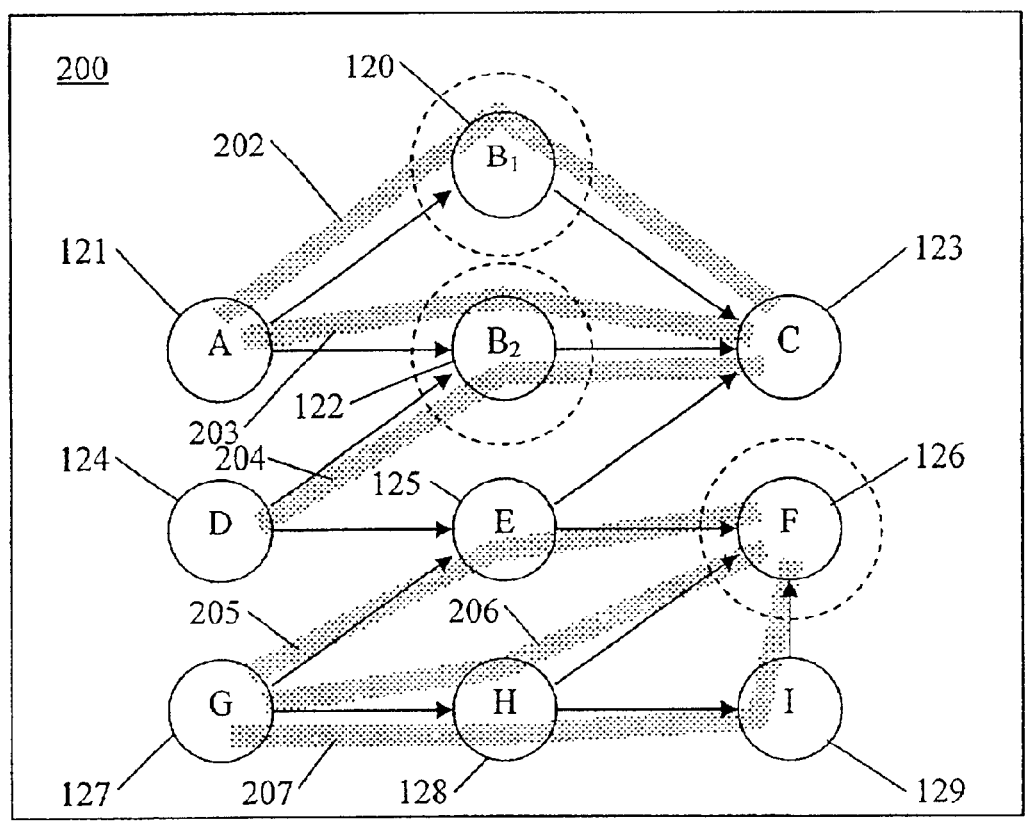

An example of the operation of the present invention is now described with reference to the circuit design of FIG. 1. Input device 314 supplies a static timing analysis of the circuit design. The static timing is performed using tools known to persons skilled in the art to the remainder of computer 300. Computer 300 responds to the static timing analysis by performing failing path set generation step 404 (FIG. 4). In step 502, computer 300 initializes a failing path list 602 with node paths failing to achieve the passing frequency. A static timing analysis of FIG. 2 indicates node paths A.B1.C, A.B2.C, D.B2.C, G.E.F, G.H.F, and G.H.J.F are on the failing path list. The remaining pathes, i.e., it is to be understood that in an alternate embodiment, the static timing analysis includes only timing results and not failing path list 602. If failing path list 602 is not supplied to computer 300, the computer processes the timing results to generate failing path list 602.

During steps 504 through 510, computer 300 converts node paths A.B1.C, A.B2.C, D.B2.C, G.E.F, G.H.F, and G.H.I.F to node pattern set A, B1,B2,C, D, E, F, G, H, and I.

Node pattern F is the most likely to fail since three failing paths contain F and three passing paths contain F. Computer 300 responds to these values to calculate Equation 1 to determine the resulting failure probability is 100% or P(F)= 3/3. Computer 300 then creates node pattern F failing path set 604 that includes failing paths G.E.F, G.H.F, and G.H.I.F. Computer 300 removes paths G.E.F, G.H.F, and G.H.I.F from failing path list 602 and iterates the process using remaining failing path list 606 that consists of A.B1.C, A.B2.C, and D.B2.C.

Because the remaining node pattern set consists of A, B1, B2, C, and D, Computer 300 at step 510 determines that node patterns remain to be converted. Computer 300 then determines during operation 512 that the most likely to fail node pattern is B2. Two failing paths A.B2.C and D.B2.C contain B2 and two passing paths contain B2. Then, computer 300 during operation 514 creates node pattern B2 failing path set 608 that includes paths A.B2.C and D.B2.C which the computer removed during step 516. Removing paths A.B2.C and D.B2.C from the failing path list 606 results in A.B1.C as the remaining failing path at step 518 and the process iterates one last time resulting in a node pattern B1 bucket including node path A.B1.C.

In step 406, computer 300 merges the B1 and B2 failing path sets into a B* failing path set including node paths A.B1.C, A.B2.C, and D.B2.C. The F failing path set is not merged with any of the B1, B2, or B* failing path sets. Computer 300 then provides as output in step 520 the failing path set matching the F node pattern, i.e., failing paths D.E.F, G.H.F, and G.H.I.F, and the failing path set matching the B* node pattern, i.e., failing paths A.B1.C, A.B2.C, and D.B2.C.

It will be readily seen by one of ordinary skill in the art that the present invention fulfills all of the objects set forth above. After reading the foregoing specification, one of ordinary skill will be able to affect various changes, substitutions of equivalents and various other aspects of the invention as broadly disclosed herein. It is therefore intended that the protection granted hereon be limited only by the definition contained in the appended claims and equivalents thereof.

For example, it is to be understood that the present invention is not restricted to being implemented in any particular programming language or operating on a particular computer hardware or operating system. The specific descriptions provided above are intended to be exemplary in nature and not restrictive.

What is claimed is:

1. A method of enabling failing paths of an analyzed integrated circuit to be grouped, the failing paths (a) including series connected nodes having names and (b) being included in a list, the node names in the failing paths being represented as node patterns and grouped into node pattern sets, comprising:

(A) determining the node pattern in the node pattern set that is most likely to fail in response to a measure of probability of failure of a node pattern in a path on the list;

(B) placing in a failing path set the paths most likely to fail based on the determination of step (A);

(C) repeating steps (A) and (B) until each path on the list is in a failing path set by using paths not placed in a failing path set and node patterns not determined to be most likely to fail.

2. The method of claim 1 further including merging failing path sets.

3. The method of claim 2 wherein the measure of probability is determined in response to the number of failing paths including the node pattern relative to the total number of paths including the node pattern.

4. The method of claim 2 wherein step (A) is also performed in response to the number of failing paths including the node pattern.

5. The method of claim 1 wherein step (A) is also performed in response to the number of failing paths including the node pattern.

6. The method of claim 1 wherein the measure of probability is determined in response to the number of failing paths including the node pattern relative to the total number of paths including the node pattern.

7. The method of claim 6 wherein step (A) is also performed in response to the number of failing paths including the node pattern.

8. The method of claim 1 wherein step (C) includes removing the paths in the failing paths set from the list.

9. The method of claim 1 wherein step (C) includes and removing the most likely to fail node pattern from the node pattern set.

10. A computer-readable medium, comprising:

at least one sequence of machine executable instructions for enabling failing paths of an analyzed integrated circuit design to be grouped, the failing paths (a) including series connected nodes having names and (b) being included in a list, the node names in the failing paths being represented as node patterns and grouped in a node pattern set, and the medium bearing the executable instructions in machine form, wherein execution of the instructions by one or more processors causes the one or more processors to:

(A) determine the node pattern in the node pattern set that is most likely to fail in response to a measure of probability of failure of a node pattern in a path on the list;

(B) place in a failing path set the paths most likely to fail based on the step (A) determination;

(C) repeating steps (A) and (B) until each path on the list is in a failing path set by using paths not placed in a failing path set and node patterns not determined to be most likely to fail.

11. The medium of claim 10, wherein step (A) is also performed in response to the number of failing paths including the node pattern.

12. The medium of claim 10, further comprising machine executable instructions, wherein execution of the instructions by one or more processors causes the one or more processors to merge failing path sets.

13. The medium of claim 12, wherein the measure of probability is determined in response to the number of failing paths including the node pattern relative to the total number of paths including the node pattern.

14. The medium of claim 12, wherein step (A) is also performed in response to the number of failing paths including the node pattern.

15. The medium of claim 10, wherein the measure of probability is determined in response to the number of failing paths including the node pattern relative to the total number of paths including the node pattern.

16. The medium of claim 15 wherein step (A) is also performed in response to the number of failing paths including the node pattern.

17. The medium of claim 10 wherein step (C) includes removing the paths in the failing path set from the list.

18. The medium of claim 10 wherein step (C) includes removing the most likely to fail node pattern from the node pattern set.

19. A computer system for enabling failure paths of an analyzed integrated circuit design to be grouped, comprising:

a processor; and a memory coupled to said processor, the memory having stored therein failing paths including series connected nodes having names, the failing paths being included in a list, the node names in the failing paths being represented as node patterns and grouped into node pattern sets, and sequences of instructions, which when executed by said processor, cause said processor to perform the steps of:

(A) determining the node pattern in the node pattern set that is most likely to fail in response to a measure of probability of failure of a node pattern in a path on the list;

(B) placing in a failing path set the paths most likely to fail based on the determination of step (A);

(C) repeating steps (A) and (B) until each path on the list is in a failing path set by using paths not placed in a failing path set and node patterns not determined to be most likely to fail.

20. The computer system of claim 19, wherein step (A) is also performed in response to the number of failing paths including the node pattern.

21. The computer system of claim 19, further comprising instructions, which when executed by the processor, cause said processor to perform the step of merging failing path sets.

22. The computer system of claim 21, wherein the measure of probability is determined in response to the number of failing paths including the node pattern relative to the total number of paths including the node pattern.

23. The computer system of claim 21, wherein step (A) is also performed in response to the number of failing paths including the node pattern.

24. The computer system of claim 19, wherein the measure of probability is determined in response to the number of failing paths including the node pattern relative to the total number of paths including the node pattern.

25. The computer system of claim 24, wherein step (A) is also performed in response to the number of failing paths including the node pattern.

26. The computer system of claim 19, wherein step (C) includes removing the paths in the failing path set from the list.

27. The computer system of claim 19, wherein step (C) includes removing the most likely to fail node pattern from the node pattern set.

28. A computer program, including a sequence of instructions which, when executed by a computer, cause the computer to perform the steps of claim 1.

* * * * *